US012631276B2

(12) United States Patent (10) Patent No.: US 12,631,276 B2
Minahan et al. (45) Date of Patent: May 19, 2026

(54) BLIND MATE LIQUID QUICK DISCONNECT COUPLER

(71) Applicant: ChargePoint, Inc., Campbell, CA (US)

(72) Inventors: Jason Minahan, Los Altos Hills, CA (US); Mike MacGregor, San Jose, CA (US)

(73) Assignee: CHARGEPOINT, INC., Campbell, CA (US)

( * ) Notice: Subject to any disclaimer, the term of this patent is extended or adjusted under 35 U.S.C. 154(b) by 0 days.

(21) Appl. No.: 18/927,460

(22) Filed: Oct. 25, 2024

(65) Prior Publication Data

US 2025/0137565 A1 May 1, 2025

Related U.S. Application Data

(60) Provisional application No. 63/593,822, filed on Oct. 27, 2023.

(51) Int. Cl.
*F16L 37/34* (2006.01)
*H05K 7/20* (2006.01)

(52) U.S. Cl.
CPC .......... *F16L 37/34* (2013.01); *H05K 7/20927* (2013.01); *H05K 7/20272* (2013.01)

(58) Field of Classification Search
None
See application file for complete search history.

(56) References Cited

U.S. PATENT DOCUMENTS

| | | | |
|---|---|---|---|
| 6,380,637 B1 * | 4/2002 | Hsu ......................... | B60L 58/34 |
| | | | 290/1 R |
| 9,512,948 B2 | 12/2016 | Nowack et al. | |
| 11,456,092 B2 * | 9/2022 | Mayer .................... | H01B 9/006 |
| 11,469,531 B2 * | 10/2022 | Cole ....................... | B60L 53/11 |
| 11,718,192 B2 * | 8/2023 | Führer ................... | H01R 24/30 |
| | | | 320/109 |

(Continued)

FOREIGN PATENT DOCUMENTS

| | | | |
|---|---|---|---|
| CA | 2888229 A1 | | 4/2013 |
| CN | 207250807 U | * | 4/2018 |

OTHER PUBLICATIONS

International Search Report and Written Opinion, PCT App. No. PCT/US2024/053065, Jan. 29, 2025, 14 pages.

*Primary Examiner* — Courtney L Smith
(74) *Attorney, Agent, or Firm* — NICHOLSON DE VOS WEBSTER & ELLIOTT LLP

(57) ABSTRACT

An electric vehicle supply equipment (EVSE) includes a blind mate liquid quick disconnect coupler that includes a male coupling and a female coupling. The male coupling includes a pressure relief poppet valve that is positioned within the main body of the coupling. The pressure relief poppet valve controls fluid through the male coupling. The pressure relief poppet valve includes an overpressure poppet, a conical spring positioned about the overpressure poppet, and a carrier poppet that includes four prongs. The female coupling includes an opening to accept a main body of the male coupling and an end for coupling with a second fitting base of the female coupling. When the male coupling is mated with the female coupling, the pressure relief poppet valve and the tube plunger are displaced such that fluid flows between the male coupling and the female coupling.

17 Claims, 16 Drawing Sheets

(56) References Cited

U.S. PATENT DOCUMENTS

| | | | |
|---|---|---|---|
| 2014/0286710 A1* | 9/2014 | Krohn | F16L 37/30 |
| | | | 405/184.1 |
| 2020/0063904 A1* | 2/2020 | Vranish | F16L 37/34 |
| 2020/0284387 A1* | 9/2020 | Wall | F16L 21/08 |
| 2020/0303093 A1* | 9/2020 | Cantz | H01R 9/11 |
| 2021/0100138 A1 | 4/2021 | Chen et al. | |
| 2022/0234455 A1* | 7/2022 | Fuehrer | B60L 53/302 |
| 2022/0410743 A1* | 12/2022 | Choi | B60L 53/18 |
| 2023/0283000 A1* | 9/2023 | Kempf | H01R 13/03 |
| | | | 439/485 |
| 2024/0152139 A1* | 5/2024 | Smith | B62D 13/06 |
| 2024/0317092 A1* | 9/2024 | Li | B60L 53/302 |

* cited by examiner

105

218

220

1110

110

1212

1210

2300

BLIND MATE LIQUID QUICK DISCONNECT COUPLER

CROSS-REFERENCE TO RELATED APPLICATIONS

This application claims the benefit of U.S. Provisional Application No. 63/593,822, filed Oct. 27, 2023, which is hereby incorporated by reference.

FIELD

Embodiments of the invention relate to the field of couplers; and more specifically, to a blind mate liquid quick disconnect coupler.

BACKGROUND

Blind mate liquid quick disconnect couplers are used to connect a fluid path in situations where access or visibility is limited. Such couplers typically include a male component and a female component. A conventional male component may have a body with a flat wrench shape that can be prone to become loose during assembly. A conventional male component with an overpressure poppet may use an O-ring to seal between two faces leaving the O-ring compression unconstrained. A conventional female component may have a spring support with a base with a high restriction and poor flow.

SUMMARY

A blind mate liquid quick disconnect coupler includes a male coupling and a female coupling is described. The male coupling includes a main body that is insertable into an opening of a female coupling, a first fitting base that includes a first termination, a first fitting top that has a hexagonal shape for assembly into the first fitting base, a pressure relief poppet valve that is positioned within the main body, a first spring that biases the pressure relief poppet valve in a first closed position when the male coupling is not mated with the female coupling. The pressure relief poppet valve that controls fluid through the male coupling. The pressure relief poppet valve includes an overpressure poppet, a conical spring positioned about the overpressure poppet, and a carrier poppet that includes four prongs. The female coupling includes a second fitting top that includes the opening to accept the main body of the male coupling and an end for coupling with a second fitting base of the female coupling; a tube plunger that is positioned within the second fitting top; a center pedestal spring support; a second spring that is positioned about the center pedestal spring support and biases the tube plunger in a second closed position when the male coupling is not mated with the female coupling; a second fitting base that includes a second termination. When the male coupling is mated with the female coupling, the pressure relief poppet valve and the tube plunger are displaced such that fluid flows between the male coupling and the female coupling.

The blind mate liquid quick disconnect coupler may be used in an electric vehicle supply equipment (EVSE) and couple a power converter with a fluid source or pump.

BRIEF DESCRIPTION OF THE DRAWINGS

The invention may best be understood by referring to the following description and accompanying drawings that are used to illustrate embodiments of the invention. In the drawings.

DESCRIPTION OF EMBODIMENTS

Figure 1:
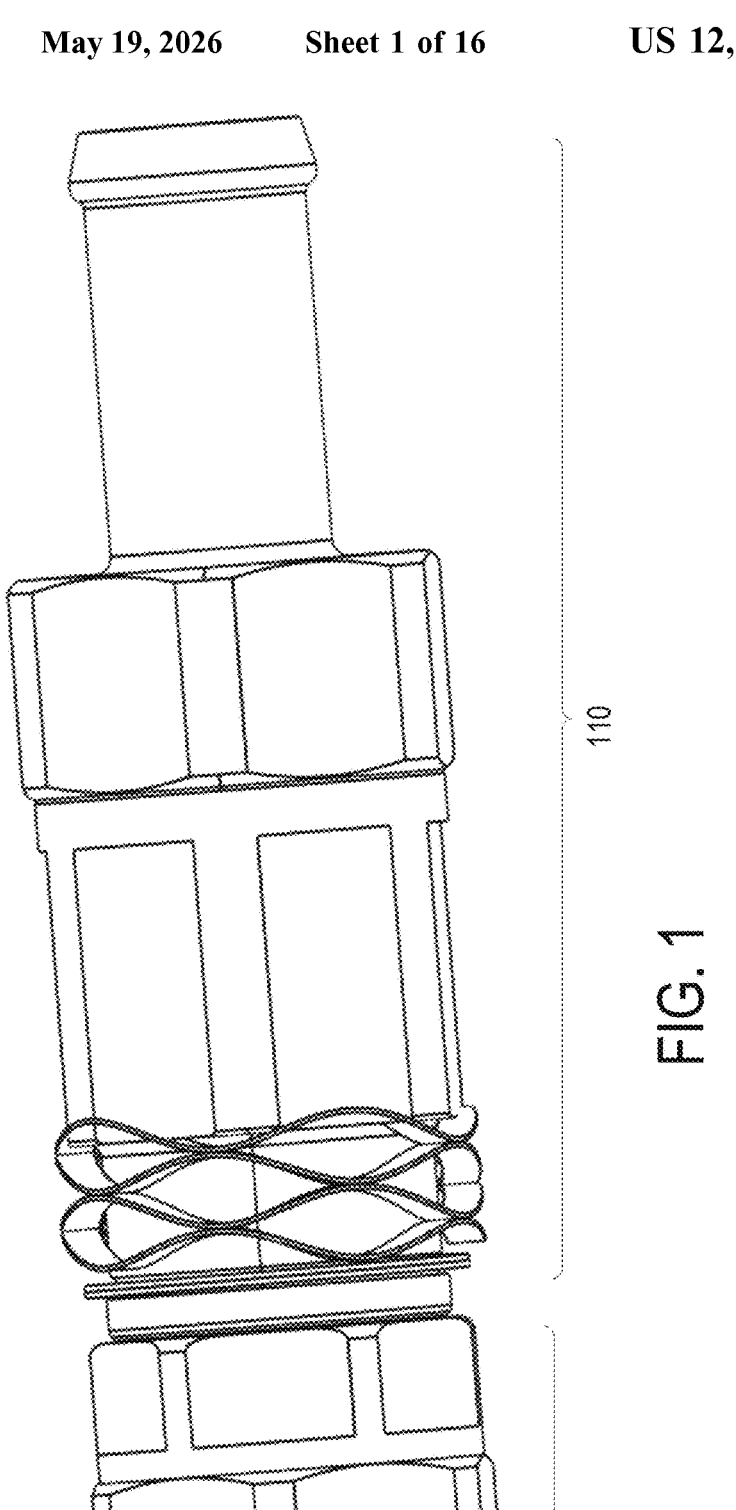
FIG. 1 illustrates a blind mate liquid quick disconnect coupler according to an embodiment.

A blind mate liquid quick disconnect coupler is described. FIG. 1 illustrates a blind mate liquid quick disconnect coupler according to an embodiment. The blind mate liquid quick disconnect coupler ("coupler") 100 includes a male coupling 105 and a female coupling 110. The male coupling 105 mates with the female coupling 110 to create a fluid pathway. The female coupling 110 may connect to a liquid source (e.g., a liquid reservoir) and the male coupling 105 may connect to a device that uses the liquid passed through the coupler 100 (e.g., for liquid cooling). The male coupling has a fitting top that has a hexagonal shape that can withstand larger installation torques and use a more convenient socket wrench compared to flat wrench shapes. The male coupling includes a pressure relief poppet valve that includes a four-prong design of the carrier poppet for larger flow rate compared to conventional carrier poppets.

Figure 2:
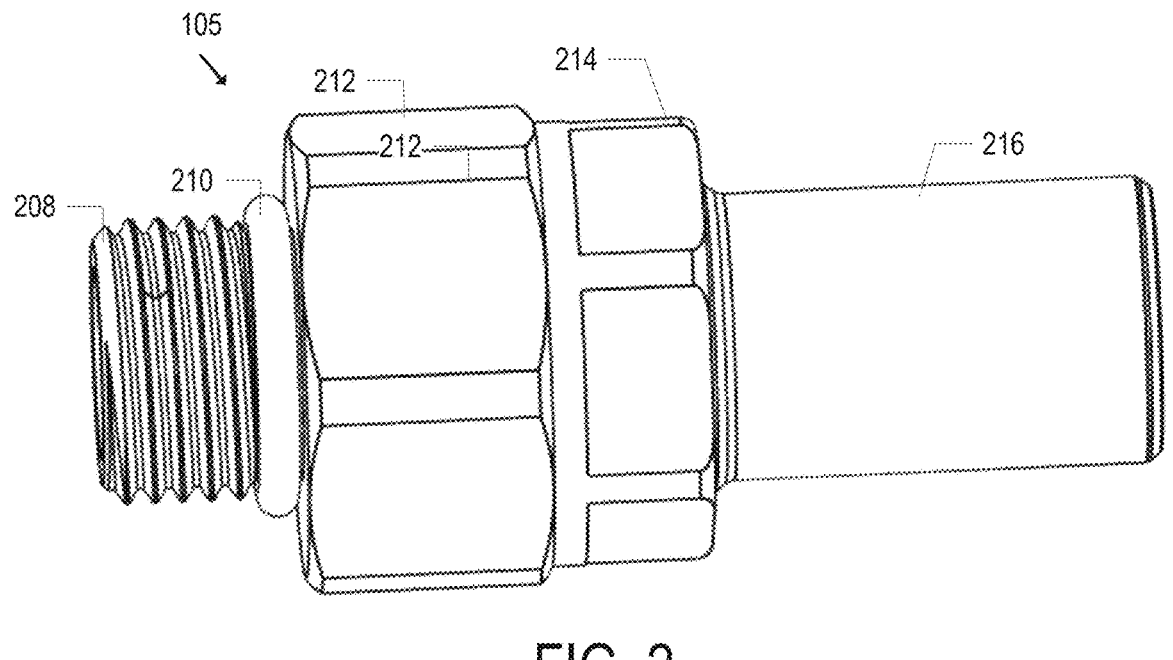
FIG. 2 shows the male coupling in greater detail when it is not mated with the female coupling according to an embodiment.
Figure 3:
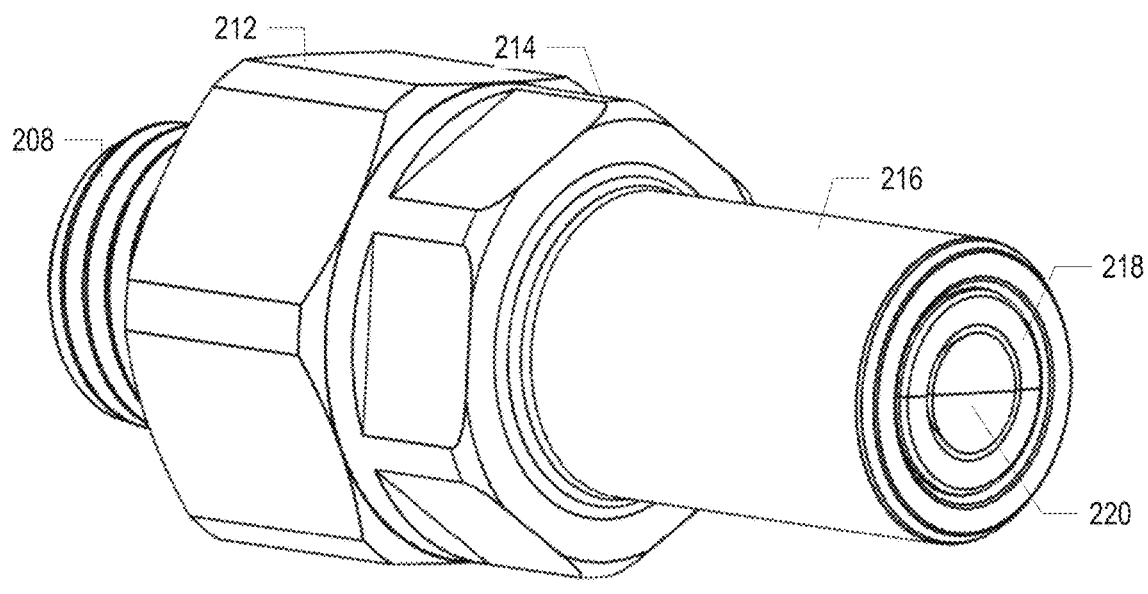
FIG. 3 shows another angle of the male coupling shown in FIG. 2.
Figure 4:
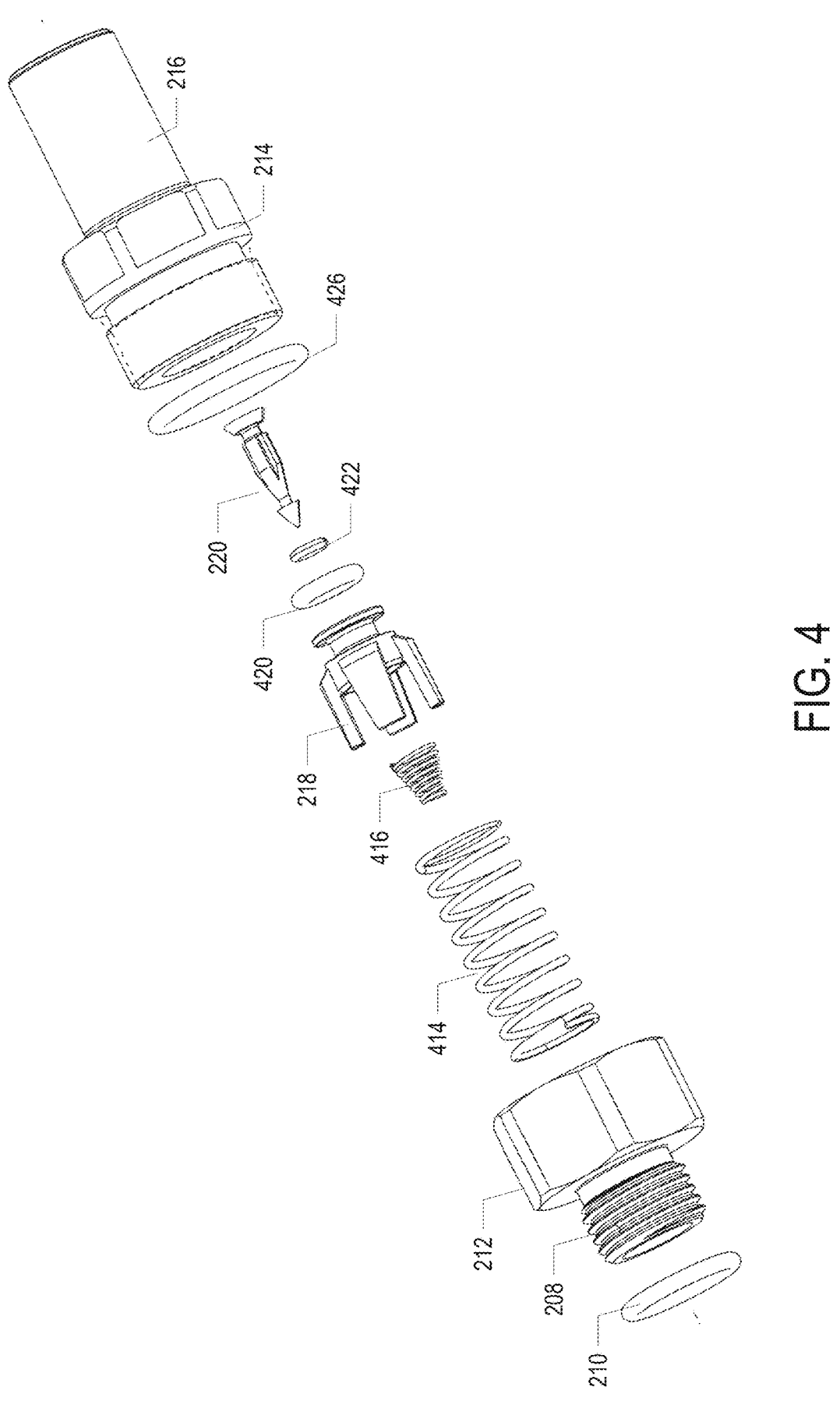
FIG. 4 shows an exploded view of the male coupling shown in FIG. 2 according to an embodiment.
Figure 5:
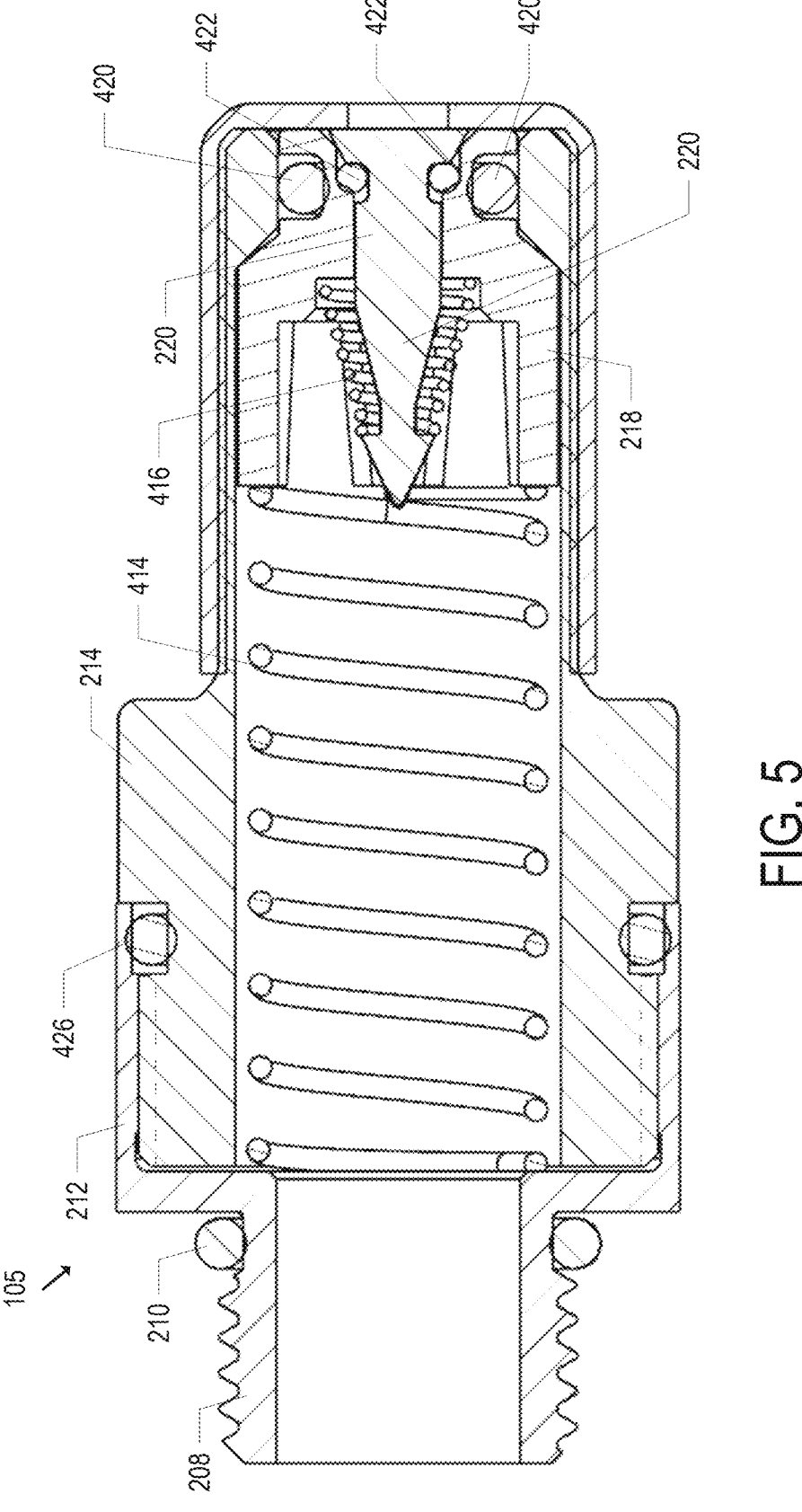
FIG. 5 shows a cross-section view of the male coupling shown in FIG. 2 according to an embodiment.

FIG. 2 shows the male coupling 105 in greater detail when it is not mated with the female coupling 110, according to an embodiment. FIG. 3 shows another angle of the male coupling 105 shown in FIG. 2. FIG. 4 shows an exploded view of the male coupling 105 shown in FIG. 2 according to an embodiment. FIG. 5 shows a cross-section view of the male coupling 105 according to an embodiment. The cross-section view of the male coupling 105 is when the male coupling 105 is not mated with the female coupling 110.

The male coupling 105 includes the fitting base 212 that connects to the fitting top 214 and the main body 216. An O-ring 426 provides a seal between the connection between the fitting base 212 and the fitting top 214. The fitting top 214 is hexagonal shaped for assembly (connecting the fitting base 212 and the fitting top 214) that can withstand larger installation torques than a fitting top with a flat wrench shape. In an embodiment, the fitting top 214 and the main body 216 are a single machined part. The fitting base 212 terminates to an external component (e.g., a device that uses the liquid passed through the coupler 100) through the termination 208 (e.g., a straight thread union). The O-ring 210 provides a seal for the connection between the fitting base 212 and the external component. The main body 216 mates with a component of the female coupling 110. As will be shown in more detail in other figures, a pressure relief poppet valve fits within the main body 216 and controls fluid flow through the male coupling 105.

The male coupling 105 includes a pressure relief poppet valve that fits within the main body 216. The pressure relief poppet valve controls the flow of fluid through the male coupling 105. The pressure relief poppet valve includes the overpressure poppet 220 and the carrier poppet 218. As shown in FIG. 3, the base of the carrier poppet 218 and the base of the overpressure poppet 220 are substantially flush with the face of the main body 216 when not mated with the female coupling 110.

Figure 6:
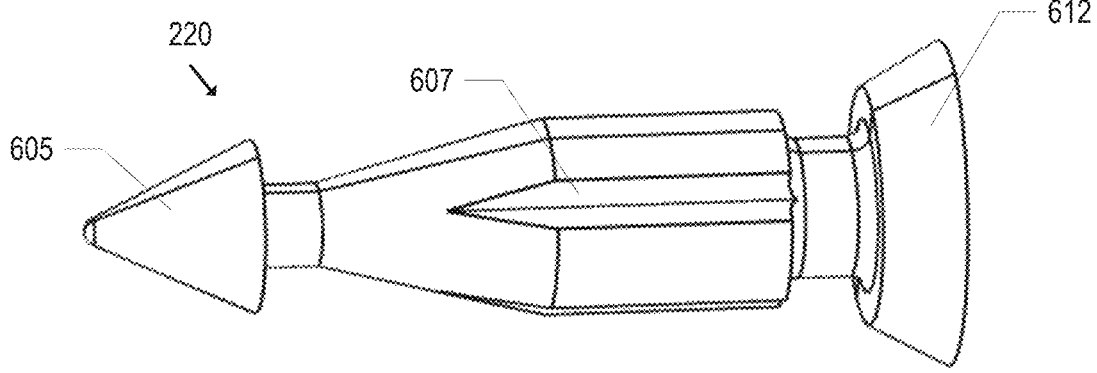
FIG. 6 shows the overpressure poppet from the male coupling according to an embodiment.
Figure 7:
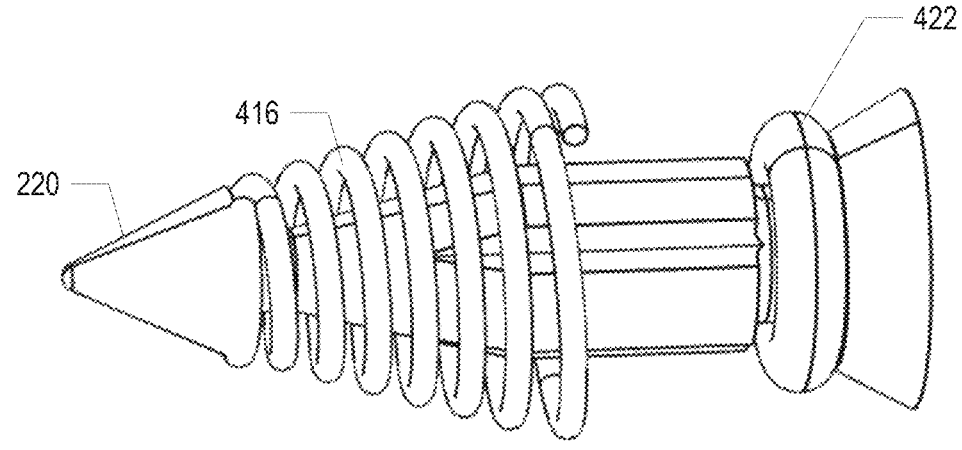
FIG. 7 shows the overpressure poppet of the male coupling with an O-ring and a conical spring.

FIG. 6 shows the overpressure poppet 220 of the male coupling 105 according to an embodiment. The overpressure poppet 220 includes a cone shaped tip 605, a number of cutouts 607, and a base 612. The cutouts 607 allow for fluid to move around the overpressure poppet 220. The overpressure poppet 220 includes a gland designed with a facial seal to avoid friction force impact on pop-off pressure. The facial seal prevents liquid from leaking. FIG. 7 shows the overpressure poppet 220 with an O-ring 422 and a conical spring 416. The O-ring 422 provides the facial seal (as opposed to a radial or piston seal).

Figure 8:
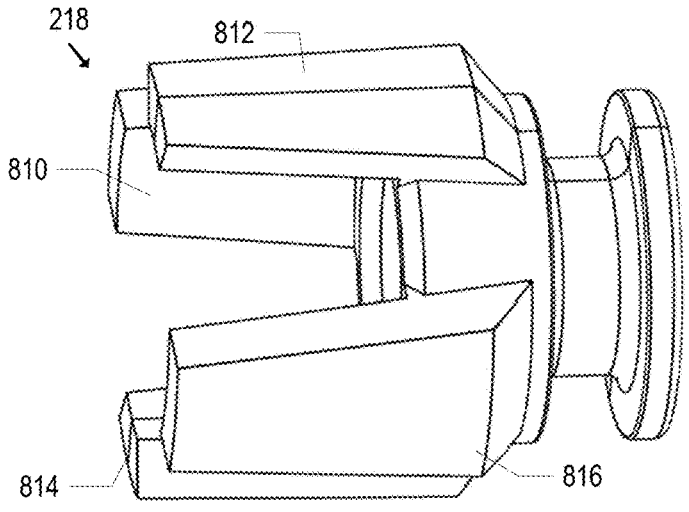
FIG. 8 shows the carrier poppet of the male coupling according to an embodiment.

FIG. 8 shows the carrier poppet 218 of the male coupling 105 according to an embodiment. The carrier poppet 218 includes four prongs (810, 812, 814, and 816). A four-prong design of the carrier poppet 218 allows for larger flow rate compared to other types of carrier poppets. For example, compared to a conventional carrier poppet that has two prongs, the four-prong design of the carrier poppet 218 has an increased cross-sectional flow area that allows for larger flow rate. An increased flow rate reduces the load on a fluid pump (not shown in these figures) which can lead to lower temperatures inside the device with the pump. Lower temperatures tend to increase the life of the device. Further, a four-prong design of the carrier poppet 218 is more secure than a conventional two prong design because of four points of contact on the spring 414 instead of two points of contact.

Figure 9:
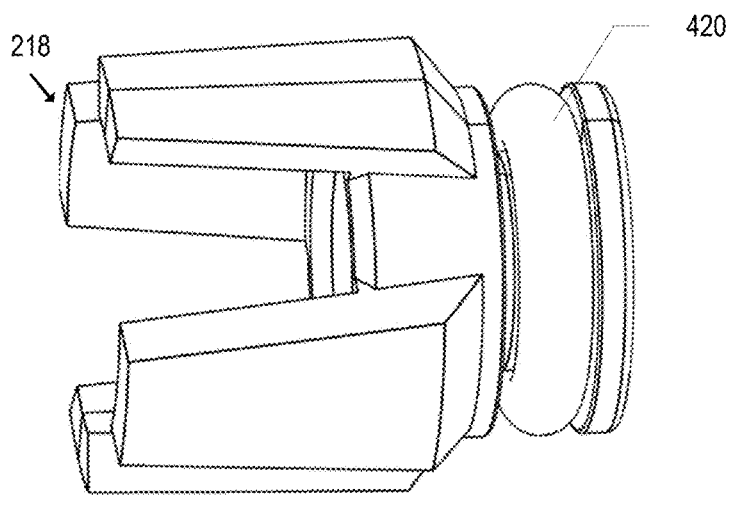
FIG. 9 shows the carrier poppet shown in FIG. 8 with an O-ring being fitted to provide a seal.
Figure 10:
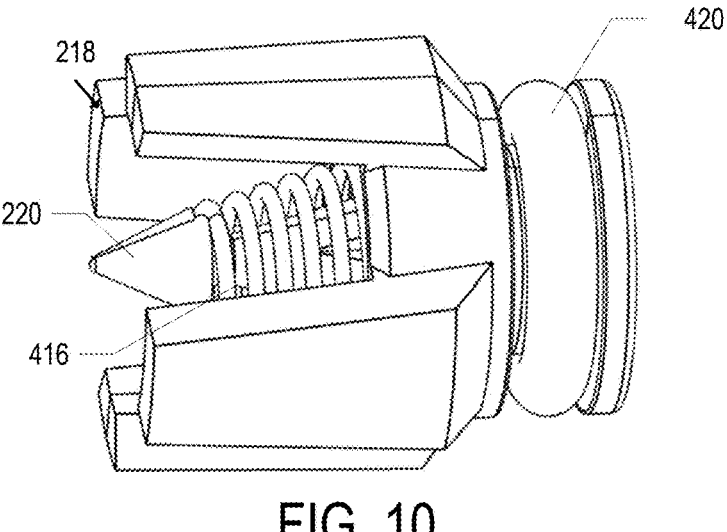
FIG. 10 shows the carrier poppet with overpressure poppet fitted within.

FIG. 9 shows the carrier poppet 218 shown in FIG. 8 with the O-ring 420 being fitted to provide a seal. FIG. 10 shows the pressure relief poppet valve with overpressure poppet 220 fitted within the shape of the carrier poppet 218.

The spring 414 biases the pressure relief poppet valve in a closed position when the male coupling 105 is not mated with the female coupling 110. The four prongs (810, 812, 814, and 816) of the carrier poppet 218 compress the spring 414 when the male coupling 105 mates with the female coupling 110 and the pressure relief poppet valve is moved to an open position.

Figure 11:
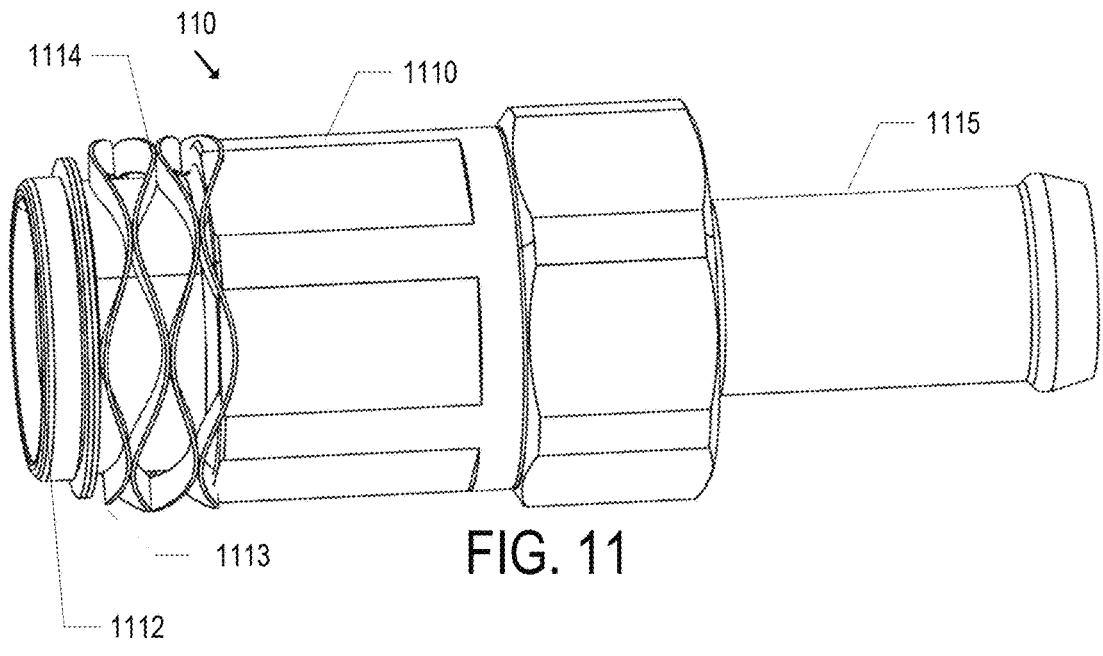
FIG. 11 shows the female coupling when it is not mated with the male coupling according to an embodiment.
Figure 12:
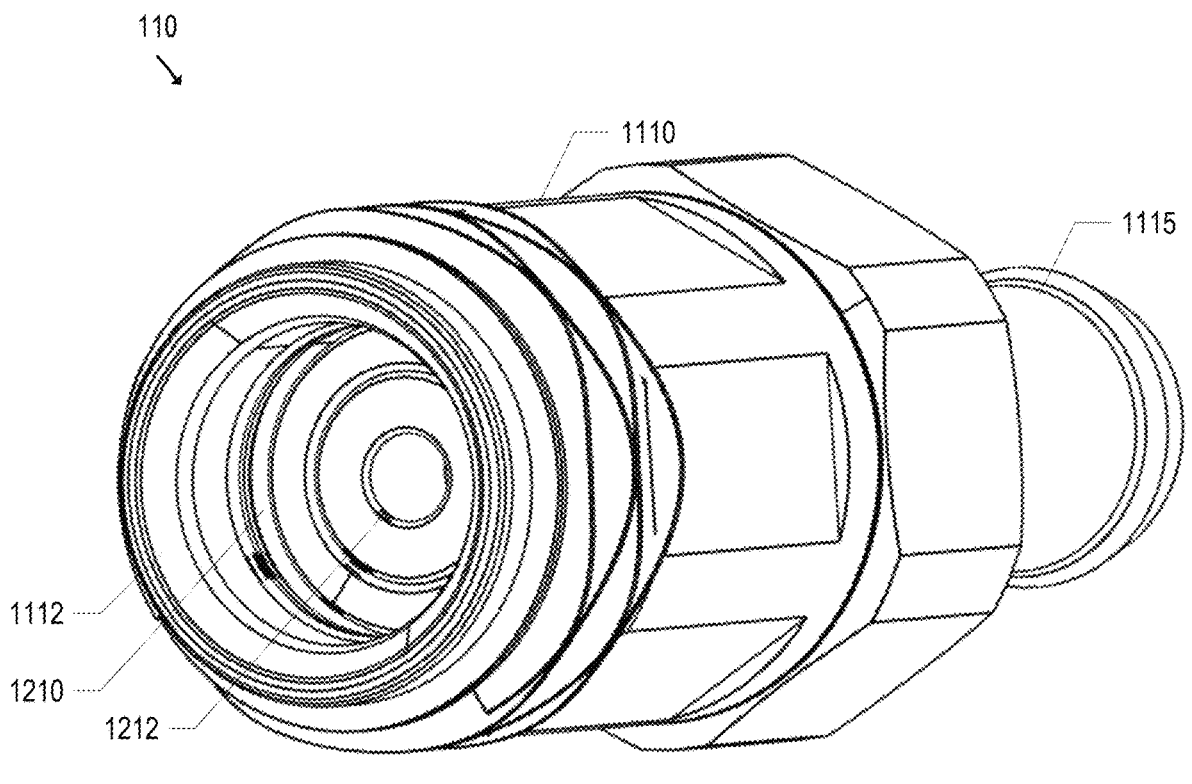
FIG. 12 shows another angle of the female coupling shown in FIG. 11.
Figure 13:
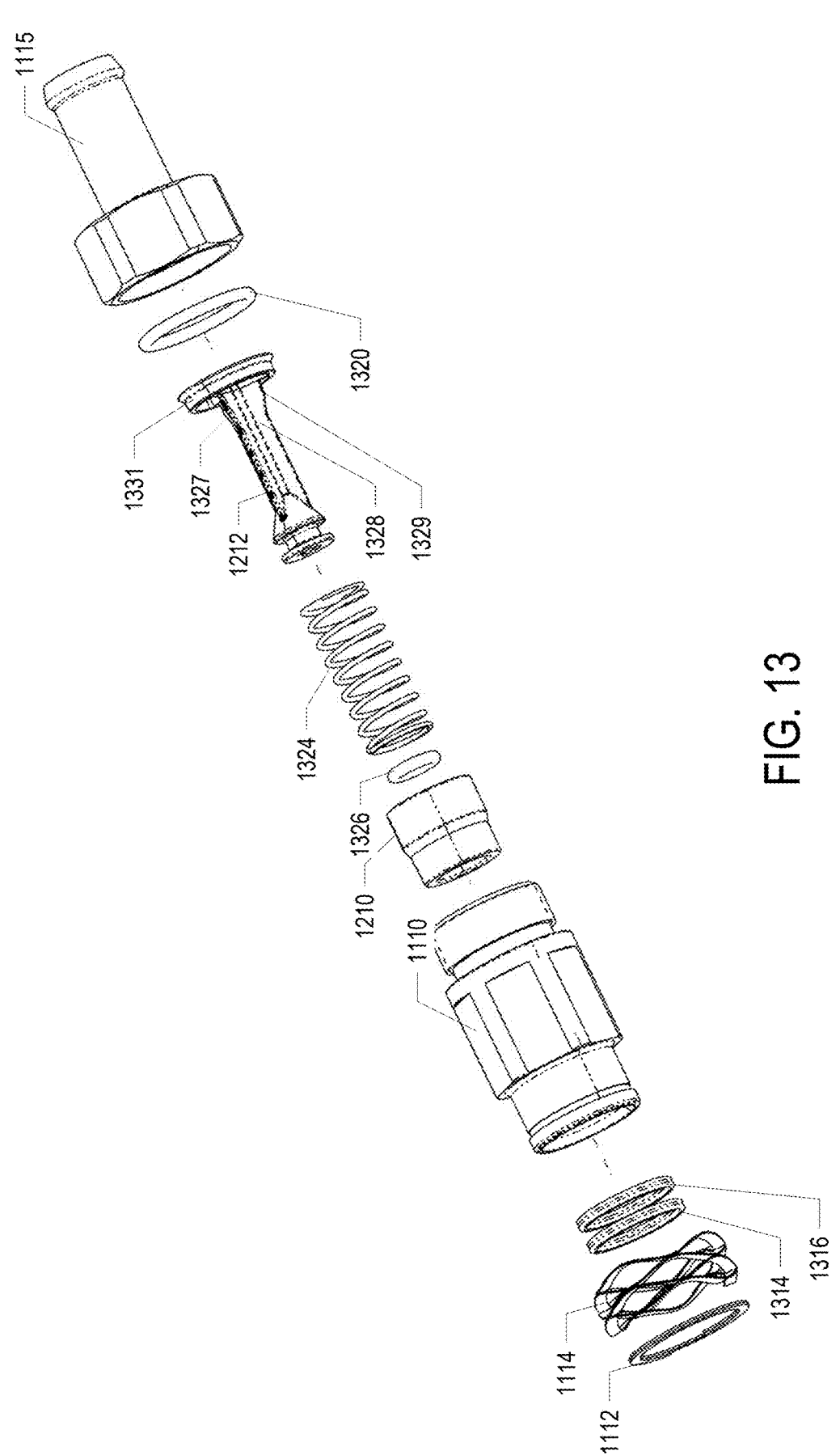
FIG. 13 shows an exploded view of the female coupling shown in FIG. 11 according to an embodiment.
Figure 14:
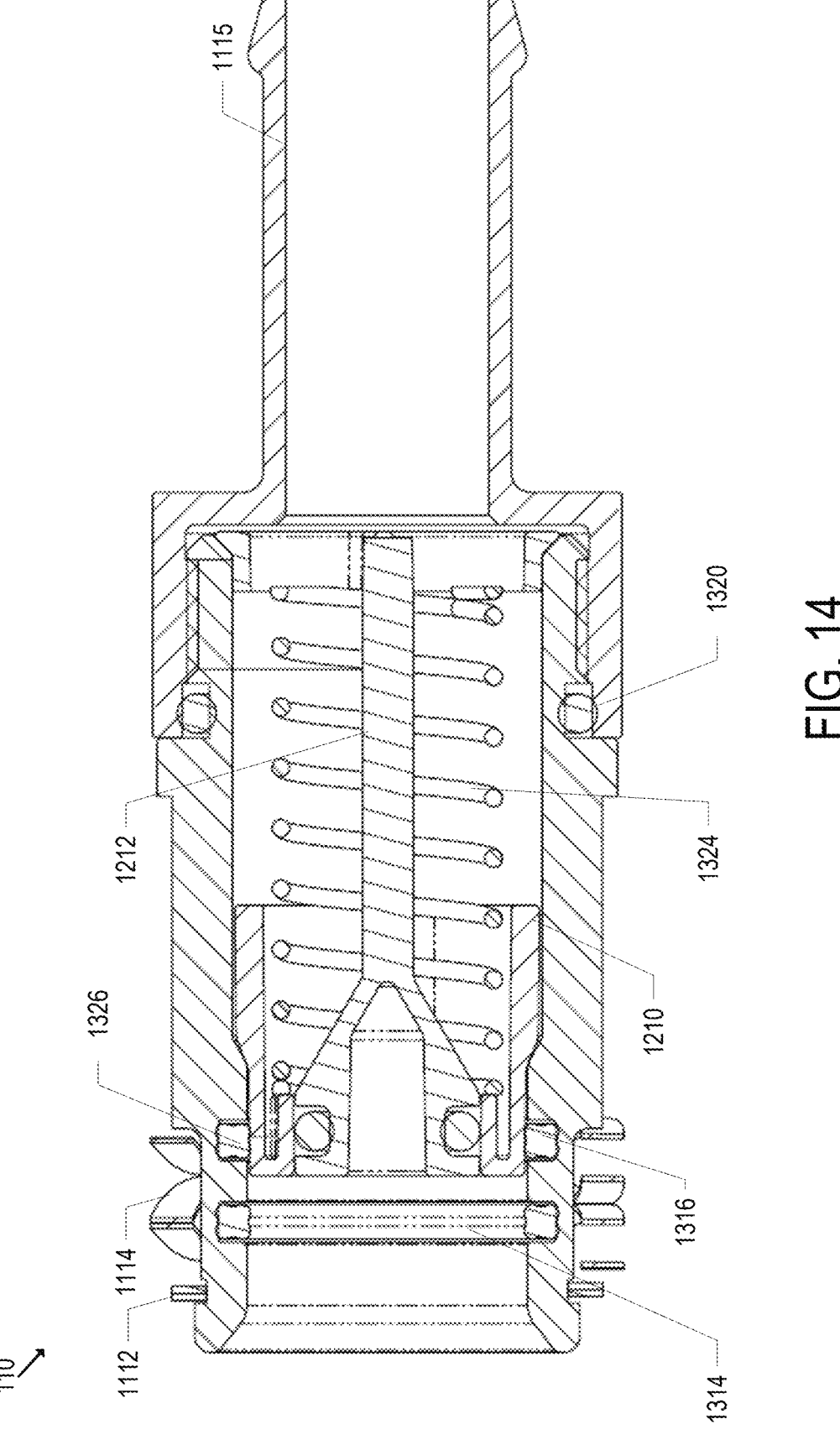
FIG. 14 shows a cross-section view of the female coupling shown in FIG. 11 according to an embodiment.

FIG. 11 shows the female coupling 110 when it is not mated with the male coupling 105 according to an embodiment. FIG. 12 shows another angle of the female coupling 110. FIG. 13 shows an exploded view of the female coupling 110. FIG. 14 shows a cross-section view of the female coupling 110 according to an embodiment. This cross-section view of the female coupling 110 is when the male coupling 105 is not mated with the female coupling 110.

Figure 15:
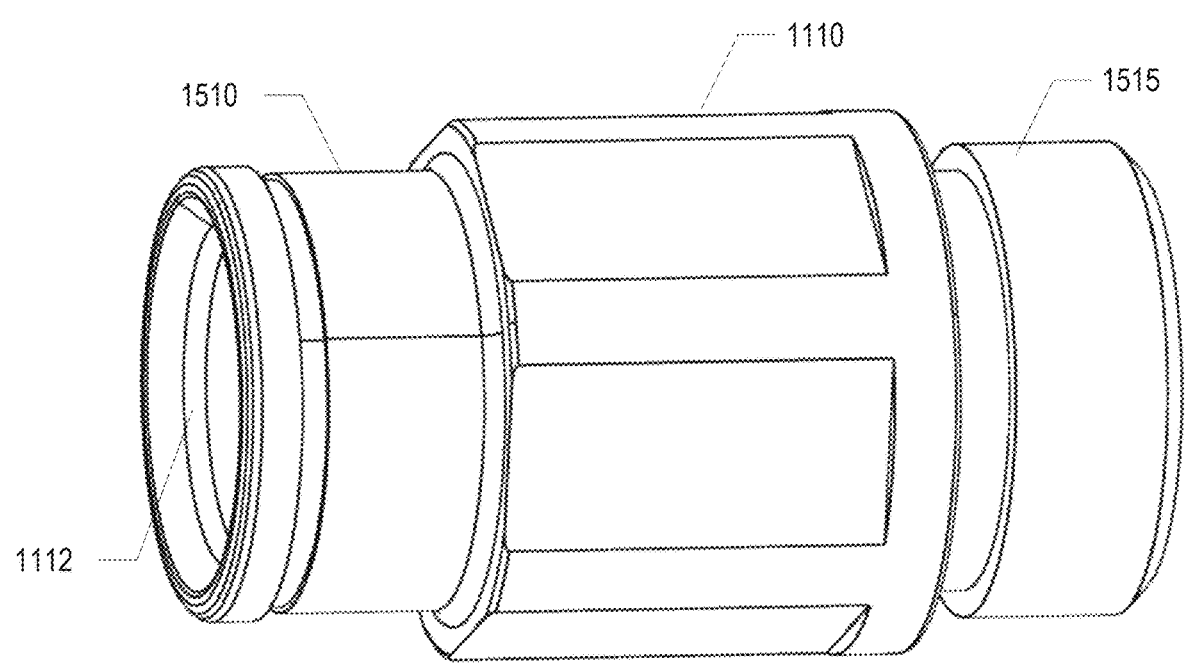
FIG. 15 shows the fitting top of the female coupling shown in FIG. 11 according to an embodiment.
Figure 16:
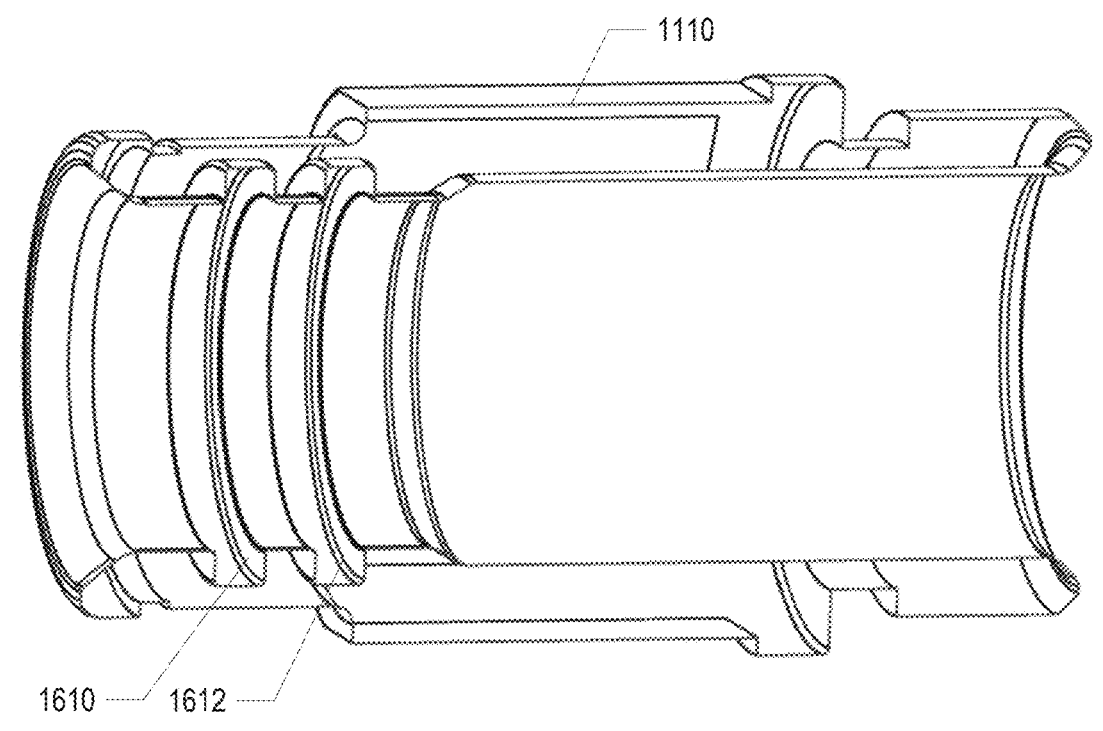
FIG. 16 shows a cross-section view of the fitting top shown in FIG. 15 according to an embodiment.

The female coupling 110 includes a fitting top 1110 and a termination (e.g., the barbed base 1115). The fitting top 1110 has a hexagonal shape for assembly. The hexagonal shape can withstand larger installation torques compared to a fitting top with a flat wrench shape. FIG. 15 shows the fitting top 1110 and FIG. 16 shows a cross-section view of the fitting top 1110. One end 1510 of the fitting top 1110 is for coupling with the male coupling 105. The fitting top 1110 includes an opening 1112 in which the main body 216 is inserted for coupling. The other end 1515 of the fitting top 1110 is for coupling with the barbed base 1115. The fitting top 1110 can be installed/mounted in a panel (e.g., a sheet metal panel). The fitting top 1110 can be installed from one side and the snap ring 1113 (e.g., a spiral lock snap ring) can be used to retain the fitting top 1110 without requiring threads. The wave spring 1114 allows the female coupling 110 to mechanically float and self-center based on its own lead-in chamfers. The fitting top 1110 includes three internal O-ring grooves. FIG. 16 shows a cross-section view of the fitting top 1110 that includes the internal O-ring groove 1610 and the internal O-ring groove 1612 for placement of the O-ring 1314 and the O-ring 1316 respectively.

The barbed base 1115 may connect to a tube that leads to a liquid reservoir or pump. The barbed base 1115 includes a hexagonal shaped termination to connect the fitting top 1110 and the barbed base 1115. An O-ring 1320 provides a seal between the fitting top 1110 and the barbed base 1115.

Figure 17:
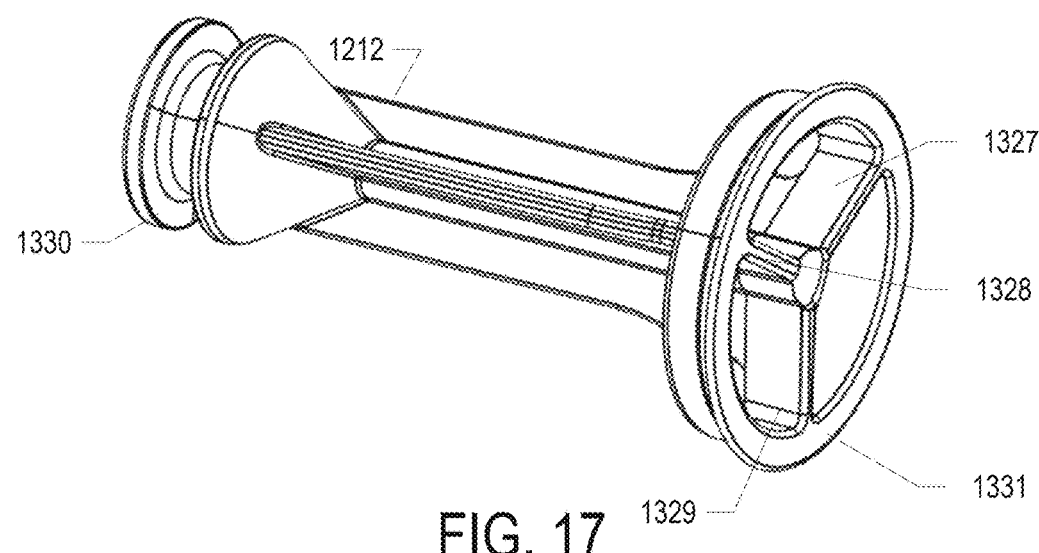
FIG. 17 shows the center pedestal spring support of the female coupling according to an embodiment.
Figure 18:
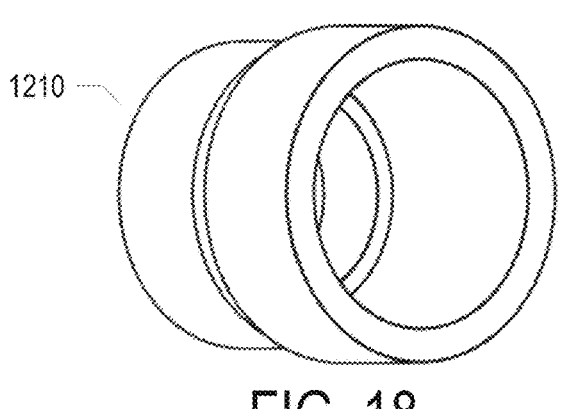
FIG. 18 shows the tube plunger of the female coupling according to an embodiment.

The female coupling 110 further includes a tube plunger 1210, a center pedestal spring support 1212, and a spring 1324. The center pedestal spring support 1212 includes a plunger end 1330 and three prongs (prong 1327, prong 1328, and prong 1329) that are connected with the circular base 1331. The three prongs and circular base 1331 are positioned against the barbed base 1115. FIG. 17 shows the center pedestal spring support 1212 according to an embodiment. The center pedestal spring support 1212 has prongs to support the spring 1324. The center pedestal spring support 1212 includes a groove for the O-ring 1326 to provide a seal. When not mated, the plunger end 1330 of the center pedestal spring support 1212 is positioned within the tube plunger 1210. FIG. 18 shows the tube plunger 1210 according to an embodiment and FIG. 19 shows the center pedestal spring support 1212 positioned within the tube plunger 1210.

Figure 19:
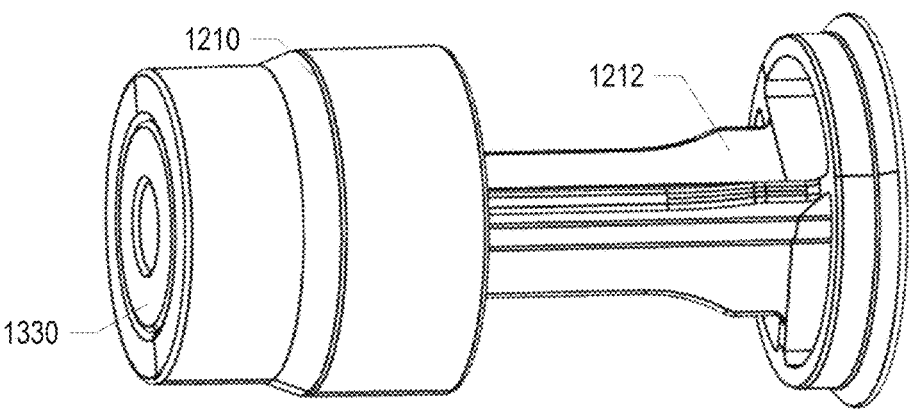
FIG. 19 shows the center pedestal spring support positioned within the tube plunger according to an embodiment.
Figure 20:
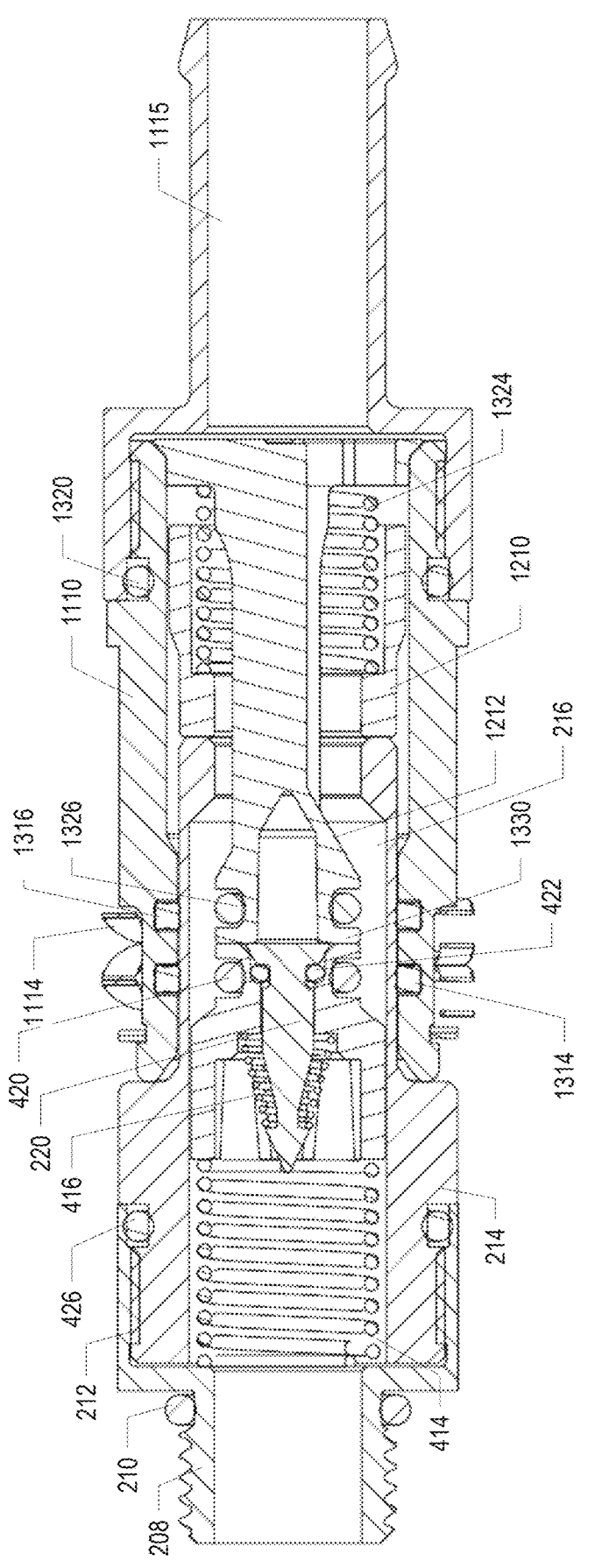
FIG. 20 is a cross-section view of the male coupling in a coupled position with the female coupling according to an embodiment.
Figure 22:
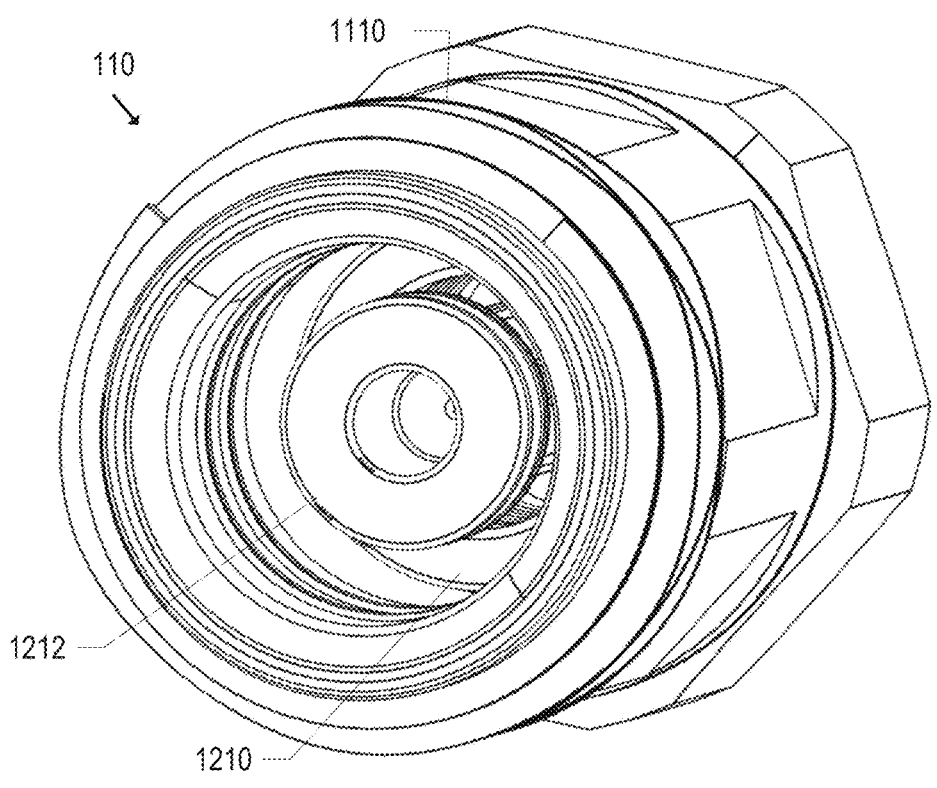
FIG. 22 shows an angle of the female coupling when it is in a coupled position according to an embodiment.

The spring 1324 is positioned about the center pedestal spring support 1212 and biases the tube plunger 1210 into a closed position (e.g., as shown in FIG. 14 and FIG. 19). When mated, the main body 216 of the male coupling 105 causes the tube plunger 1210 to move to an open position (e.g., as shown in FIG. 20 and FIG. 22) thereby opening the fluid path between the male coupling 105 and the female coupling 110. The tube plunger 1210 compresses the spring 1324 when mated.

The main body 216 fits within the opening of the fitting top 1110. The O-ring 1314 and the O-ring 1316 provide a seal when the when the male coupling 105 is mated with the female coupling 110.

FIG. 20 is a cross-section view of the male coupling 105 in a coupled position with the female coupling 110. In FIG. 20, the main body 216 of the male coupling 105 has been inserted into the opening 1112 of the fitting top 1110 of the female coupling 110. The base of the carrier poppet 218 and the base of the overpressure poppet 220 press against the plunger end 1330 of the center pedestal spring support 1212. The main body 216 moves the tube plunger 1210 to an open position. In the coupled position, the spring 414 is compressed by the carrier poppet 218 and the spring 1324 is compressed by the tube plunger 1210. The pressure relief poppet valve and the tube plunger 1210 are thus displaced and in an open position thereby allowing fluid to pass through the fluid pathway between the male coupling 105 and the female coupling 110. The main body 216 can be pulled out of the fitting top 1110 that then causes the spring 414 and the spring 1324 to return and the pressure relief poppet valve to move to the closed position.

Figure 21:
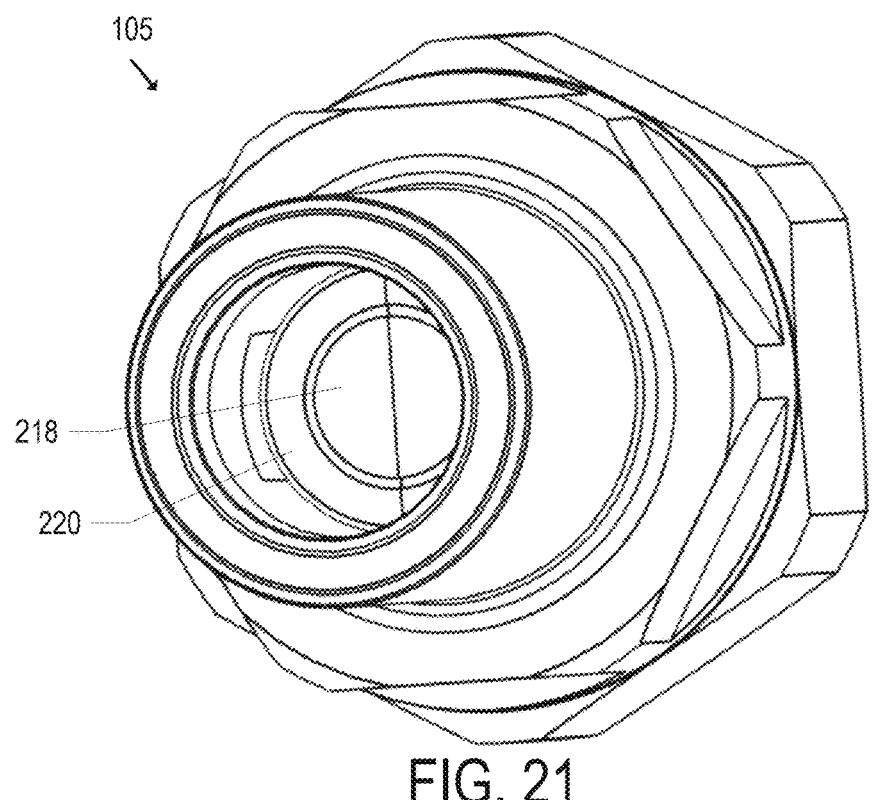
FIG. 21 shows an angle of the male coupling when it is in a coupled position according to an embodiment.

FIG. 21 shows an angle of the male coupling 105 when it is in a coupled position and FIG. 22 shows an angle of the female coupling 110 when it is in a coupled position. In FIG. 21, the female coupling 110 is not shown, and in FIG. 22, the male coupling 105 is not shown. As shown in FIG. 21, the carrier poppet 218 and the overpressure poppet 220 are displaced (compare to FIG. 3). As shown in FIG. 22, the tube plunger 1210 is displaced (compare to FIG. 12).

Figure 23:
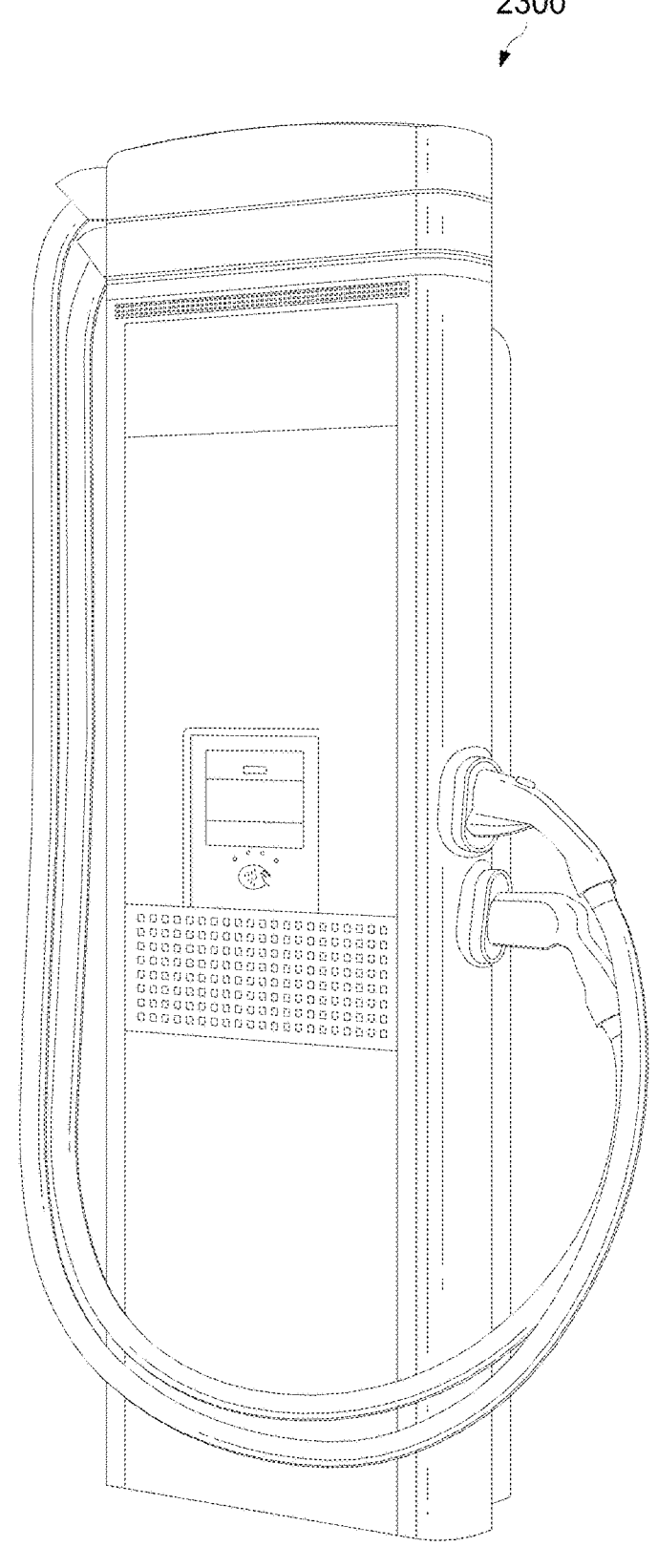
FIG. 23 illustrates an exemplary electric vehicle supply equipment (EVSE) that can include the coupler according to an embodiment.

The coupler 100 can be used in an electric vehicle supply equipment (EVSE) according to an embodiment. FIG. 23 illustrates an exemplary EVSE 2300 that can include the coupler 100. The EVSE 2300 is used for charging electric vehicles. The EVSE 2300 connects to a power source (e.g., AC main supply) to supply power for charging electric vehicles. The EVSE 2300 shows two charging cables and connectors. However, the EVSE can include one charging cable and connector or multiple charging cables and connectors. An operator of an electric vehicle may connect an electric vehicle connector connected with a charging cable to on-board charging circuitry of their electric vehicle to transfer energy to the electricity storage device of the electric vehicle. The coupler 100 is located internally to the EVSE 2300.

Figure 24:
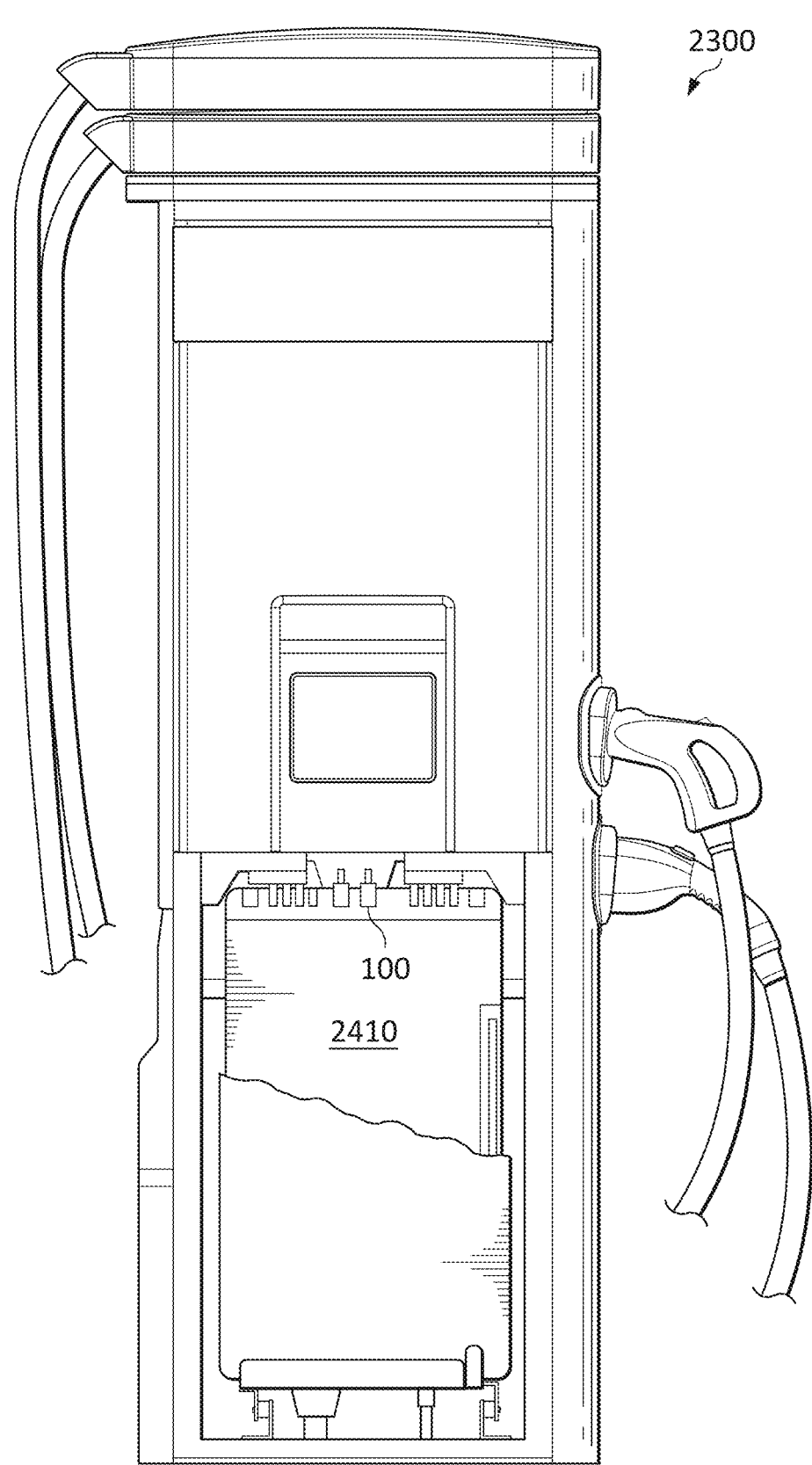
FIG. 24 shows some of the internal components of the EVSE of FIG. 23 according to an embodiment.

FIG. 24 shows some of the internal components of the EVSE 2300 according to an embodiment. The EVSE 2300 includes the power module 2410. The power module 2410 converts Alternating Current (AC) to Direct Current (DC). A coupler 100 connects an internal fluid pathway of the power module 2410 with a liquid reservoir or pump. The male coupling 105 is within the housing of the power module 2410 and the female coupling 110 is outside of the housing of the power module 2410.

Figure 25:
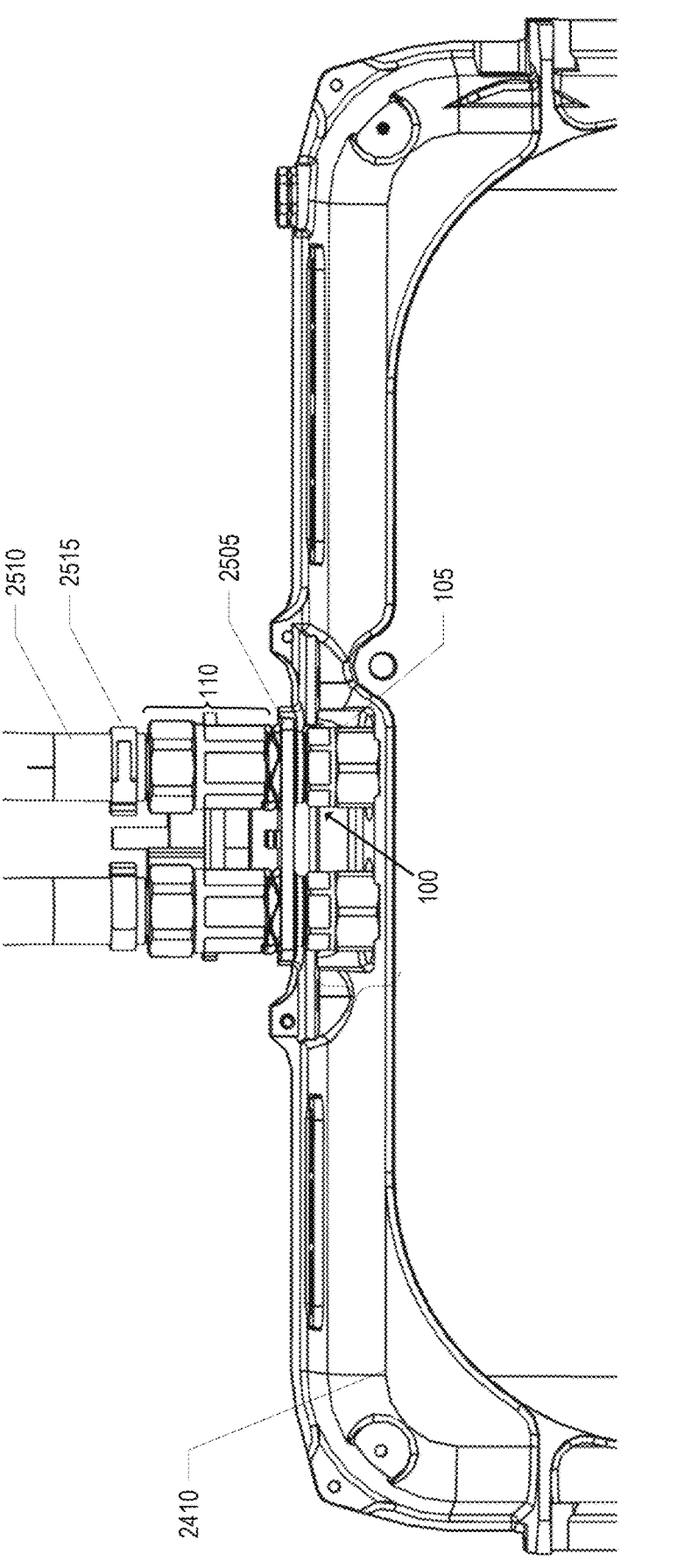
FIG. 25 shows a partial view of the power module of the EVSE that shows the coupler according to an embodiment.

FIG. 25 shows a partial view of the power module 2410 that shows the coupler 100. The fitting top 1110 of the female coupling 110 is mounted in the sheet metal panel 2505. The fitting top 1110 can be installed from one side and the snap ring 1113 (e.g., a spiral lock snap ring) can be used to retain the fitting top 1110 without requiring threads. The barbed base 1115 of the female coupling 110 is inserted in a tube 2510 that may lead to a liquid reservoir or pump of the EVSE 2300. The clamp 2515 may secure the tube 2510 to the barbed base 1115 of the female coupling 110.

The EVSE 2300 also includes other components such as contactors that open and close to provide charge transfer and a conductor to connect the contactors to the power module 2410 to convert AC mains power to DC power. The EVSE 2300 may also include a current sensor to measure current draw, a voltage sensing circuitry to measure voltage, and/or a controller to control the opening and closing of the contactors.

In the preceding description, numerous specific details are set forth to provide a more thorough understanding of the embodiments. It will be appreciated, however, by one skilled in the art that the invention may be practiced without such specific details. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Bracketed text and blocks with dashed borders (e.g., large dashes, small dashes, dot-dash, and dots) may be used herein to illustrate optional operations that add additional features to embodiments of the invention. However, such notation should not be taken to mean that these are the only options or optional operations, and/or that blocks with solid borders are not optional in certain embodiments of the invention.

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. An electric vehicle supply equipment (EVSE), comprising:
    a power converter that converts alternating current (AC) mains power to direct current (DC) power; and
    a blind mate liquid quick disconnect coupler that includes:
        a male coupling that is included within a housing of the power converter, the male coupling comprising:
            a main body that is insertable into an opening of a female coupling,
            a first fitting base that includes a first termination,
            a first fitting top that has a hexagonal shape for assembly into the first fitting base,
            a pressure relief poppet valve that is positioned within the main body, wherein the pressure relief poppet valve includes:
                an overpressure poppet,
                a conical spring positioned about the overpressure poppet, and
                a carrier poppet that includes four prongs,
            a first spring that biases the pressure relief poppet valve in a first closed position when the male coupling is not mated with the female coupling, and the pressure relief poppet valve that controls fluid through the male coupling, and a female coupling that is external to the housing of the power converter, the female coupling comprising:

a second fitting top that includes the opening to accept the main body of the male coupling and an end for coupling with a second fitting base of the female coupling, a tube plunger that is positioned within the second fitting top, a center pedestal spring support, a second spring that is positioned about the center pedestal spring support and biases the tube plunger in a second closed position when the male coupling is not mated with the female coupling, and a second fitting base that includes a second termination, wherein when the male coupling is mated with the female coupling, the pressure relief poppet valve and the tube plunger are displaced such that fluid flows between the male coupling and the female coupling.

2. The EVSE of claim 1, further comprising:

a pump that pumps fluid from a liquid reservoir to the power converter through the blind mate liquid quick disconnect coupler.

3. The EVSE of claim 1, wherein the male coupling further comprises:

a first O-ring that provides a seal for a connection between the first fitting base and the first fitting top;

a second O-ring that provides a seal for a connection between the first fitting base and the main body;

a third O-ring that provides a seal for the carrier poppet; and a fourth O-ring that provides a seal for the overpressure poppet.

4. The EVSE of claim 1, wherein the center pedestal spring support includes three prongs attached to a circular base to support the second spring.

5. The EVSE of claim 1, wherein the second fitting top includes two internal O-ring grooves for two internal O-rings.

6. The EVSE of claim 1, wherein the second termination is barbed for insertion into a tube.

7. The EVSE of claim 1, wherein the female coupling further comprises:

a snap ring for installation into a metal panel attached to the power converter.

8. The EVSE of claim 1, wherein the female coupling further comprises:

a wave spring that allows for the female coupling to mechanically float and self-center.

9. The EVSE of claim 1, wherein the second fitting top has a hexagonal shape.

10. A blind mate liquid quick disconnect coupler, comprising:

a male coupling comprising:

a main body that is insertable into an opening of a female coupling;

a first fitting base that includes a first termination;

a first fitting top that has a hexagonal shape for assembly into the first fitting base;

a pressure relief poppet valve that is positioned within the main body, wherein the pressure relief poppet valve includes:

an overpressure poppet, a conical spring positioned about the overpressure poppet, and a carrier poppet that includes four prongs;

a first spring that biases the pressure relief poppet valve in a first closed position when the male coupling is not mated with the female coupling; and the pressure relief poppet valve that controls fluid through the male coupling; and a female coupling comprising:

a second fitting top that includes the opening to accept the main body of the male coupling and an end for coupling with a second fitting base of the female coupling;

a tube plunger that is positioned within the second fitting top;

a center pedestal spring support;

a second spring that is positioned about the center pedestal spring support and biases the tube plunger in a second closed position when the male coupling is not mated with the female coupling; and a second fitting base that includes a second termination;

wherein when the male coupling is mated with the female coupling, the pressure relief poppet valve and the tube plunger are displaced such that fluid flows between the male coupling and the female coupling.

11. The blind mate liquid quick disconnect coupler of claim 10, wherein the male coupling further comprises:

a first O-ring that provides a seal for a connection between the first fitting base and the first fitting top;

a second O-ring that provides a seal for a connection between the first fitting base and the main body;

a third O-ring that provides a seal for the carrier poppet; and a fourth O-ring that provides a seal for the overpressure poppet.

12. The blind mate liquid quick disconnect coupler of claim 10, wherein the center pedestal spring support includes three prongs attached to a circular base to support the second spring.

13. The blind mate liquid quick disconnect coupler of claim 10, wherein the second fitting top includes two internal O-ring grooves for two internal O-rings.

14. The blind mate liquid quick disconnect coupler of claim 10, wherein the second termination is barbed for insertion into a tube.

15. The blind mate liquid quick disconnect coupler of claim 10, wherein the female coupling further comprises:

a snap ring for installation into a metal panel.

16. The blind mate liquid quick disconnect coupler of claim 10, wherein the female coupling further comprises:

a wave spring that allows for the female coupling to mechanically float and self-center.

17. The blind mate liquid quick disconnect coupler of claim 10, wherein the second fitting top has a hexagonal shape.

* * * * *